United States Patent [19]
Davidson et al.

[11] Patent Number: 5,572,144
[45] Date of Patent: Nov. 5, 1996

[54] TEST JIG AND METHOD FOR PROBING A PRINTED CIRCUIT BOARD

[75] Inventors: Ryan L. Davidson, Santa Cruz; Mark S. Seymour, Felton, both of Calif.

[73] Assignee: Seagate Technology, Scotts Valley, Calif.

[21] Appl. No.: 20,768

[22] Filed: Feb. 22, 1993

[51] Int. Cl.⁶ ................................................ G01R 1/02
[52] U.S. Cl. .................................... 324/755; 324/754
[58] Field of Search ........................... 324/158 F, 158 P, 324/72.5, 754, 750, 757, 758; 439/482

[56] References Cited

U.S. PATENT DOCUMENTS

| | | | |
|---|---|---|---|
| 3,564,408 | 2/1971 | Schulz et al. | 324/158 F |
| 3,757,219 | 9/1973 | Aksu | 324/158 F |
| 3,970,934 | 7/1976 | Aksu | 324/158 F |
| 4,099,120 | 7/1978 | Aksu | 324/158 F |
| 4,108,528 | 8/1978 | Long et al. | 324/754 |
| 4,138,186 | 2/1979 | Long et al. | 324/754 |
| 4,812,754 | 3/1989 | Tracy et al. | 324/158 F |
| 4,818,933 | 4/1989 | Kerschner et al. | 324/158 F |
| 4,841,241 | 6/1989 | Hilz et al. | 324/158 F |
| 4,912,400 | 3/1990 | Plante | 324/158 F |
| 4,993,136 | 2/1991 | Kerschner et al. | 324/158 F |
| 5,068,600 | 11/1991 | Hilz et al. | 324/158 F |
| 5,087,878 | 2/1992 | Belmore, III et al. | 324/72.5 |

*Primary Examiner*—Vinh P. Nguyen
*Attorney, Agent, or Firm*—Flehr, Hohbach, Test, Albritton & Herbert

[57] ABSTRACT

A test jig for probing single or double sided printed circuit boards ("PCB") containing targets statically retains the PCB in stable registration against a nest plate statically affixed to a main frame. A top frame with hinged cover, and a bottom frame are disposed above and below the main frame. Statically attached to the top cover is a top bed of nails and a clamp plate with through holes corresponding to targets on the PCB upperside. The bottom frame has statically attached thereto a bottom bed of nails whose probes can protrude through nest plate openings corresponding to targets on the PCB underside. The PCB is held statically and in registered alignment with the nest plate and during jig actuation, the top and bottom frames are moved vertically toward the PCB. Parallel aligned movement of these frames during actuation is ensured by mating alignment of main frame protruding guide rods and matching bushings affixed to the top and bottom frames. Registration between the top bed of nails, the nest plate and the bottom bed of nails is achieved by providing master tooling holes in these components (as well as the clamp plate). During setup, master tooling rods are passed through these holes, and the respective components are statically attached to the relevant frame. Because parallel movement of the top and bottom bed of nails relative to the statically retained PCB occurs, waffling, sideloading and test probe damage are minimized, and the test probes make reliable contact with the intended PCB target.

20 Claims, 6 Drawing Sheets

TEST JIG AND METHOD FOR PROBING A PRINTED CIRCUIT BOARD

FIELD OF THE INVENTION

This invention relates generally to automatic test equipment for probing a workpiece, and more specifically to a jig for retaining and electronically probing a printed circuit board containing electronic components.

BACKGROUND OF THE INVENTION

Many electronic circuits are fabricated on printed circuit boards ("PCBs"), whereon numerous electronic components such as integrated circuits ("Ics"), discrete resistors, capacitors, interconnects, and the like are mounted. Design constraints often dictate that PCBs be made ever smaller in size, yet include an ever increasing number of components.

To ensure that the circuits work properly, completed PCBs are electronically probed. Test pads are provided on one or both sides of the PCB during etching, the pads conventionally being about 0.035" diameter and spaced as closely as about 0.065" center-center. These pads are coupled via traces on the PCB to various key signals in the completed electronic circuit. During testing, the PCB is mounted in a test jig that is then activated, whereupon probes are moved into position and held against the appropriate test pads. Signals are then applied via the jig and test probes to the PCB and circuit. Various test pads are probed, and signals thereon measured, to determine whether the completed circuit is functioning properly.

FIG. 1 is a simplified depiction of a typical prior art jig 2, wherein the PCB under test 4 floats resiliently (indicated by double arrow) between a stationary lower probe bed 6 and a movable upper probe bed 8. Probe beds 6, 8 are often termed "bed of nails". As will be described, in the configuration of FIG. 1, alignment between probe beds 6 and 8, and PCB 4 occurs dynamically during jig activation. Lower probe bed 6 includes a plurality of upward facing test probes 10 that will probe targets 12 on the underside of PCB 4, while upper probe bed 8 includes downward facing test probes 14 that will probe targets 16 on the upperside of PCB 4. While FIG. 1 depicts a PCB with probe targets on two sides, PCB 4 may of course be single sided.

For ease of illustration, FIG. 1 does not depict a movable nest plate that is disposed between the lower test bed 6 and the underside of the PCB 4, or a movable upper clamp plate that is disposed between the upper test bed 8 and the upperside of PCB 4. The nest plate and clamp plate have a pattern of holes through which the test probes protrude, and have PCB-facing surfaces that are scalloped to provide clearance for components, solder joints and the like on the PCB. In the prior art jig of FIG. 1, the nest plate and clamp plate have clearance holes through which alignment tooling pins 18 pass to mate with alignment holes 22 in the PCB 4.

Test probes 10, 14 are commercially available units that typically have a nominal diameter of about 0.029", and taper to a spring-loaded point that will contact the intended target. Ideally a test probe is expected to maintain an accuracy of about 2 mils, e.g., to repeatedly contact an intended location on a PCB surrounded by a 1 mil radius. It must be appreciated that PCB process tolerances can result in targets 12, 16 being slightly mis-positioned on the PCB, and/or alignment holes 12 that are slightly mis-positioned. Thus, to reliably align with and contact a target, test probe accuracy must account for tolerance uncertainties in the location of the targets and the alignment openings themselves.

Lower probe bed 6 is firmly attached to the fixture lower frame 16, to which frame tooling pins 18 are affixed and protrude upwardly. Pins 18 protrude through holes 20 in lower probe bed 6, through holes 22 in PCB 4, and through holes 24 in the upper test bed 8 to dynamically anchor and align probe beds 6 and 8 and PCB 4. When pins 18 are new, they align relatively well with corresponding alignments holes 20, 22, 24. However after jig 2 has tested a sufficient number of PCB units 4 (e.g., several hundred or several thousand), the cumulative friction from mounting and removing PCBs 4 abrades and wears away the outer diameter of tooling pins 18. Unfortunately, as wear and tear reduces the diameter of pins 18, the alignment between test beds 6 and 8, and PCB 4 becomes looser, and the jig test probes may miss contacting their intended targets on the PCB.

After test beds 6, 8 and PCB 4 are aligned, the upper lid 26 of jig 2 is hingedly closed. A mechanism 28 creates a vacuum within jig 2, simultaneously pulling upper test bed 8 against PCB 4 and pulling PCB 4 down against lower test bed 6. Actuation also closes upper lid 26, which is forcibly aligned to the lower frame 16 by a dynamic mating engagement between bushings 40 in lid 26, and frame anchor stakes 30 in lower frame 16. Unfortunately vacuum actuation can pull particulate matter in the air into prior art test jig 2. The particulate matter can contaminate the test jig 2 and PCB 4, while the flowing air stream can produce static electric fields that can damage ICs 32.

Further, vacuum systems tend to allow PCB to "waffle" while settling against lower test bed 6 and upper test bed 8, e.g., to permit PCB 4 to attempt to rotate relative to the lower test bed instead of approaching the test bed (and the protruding probes) in a parallel orientation. It is understood that the pattern of test probe locations on the test beds 6, 8 is dictated by the location of targets on the PCB to be probed. For example, in FIG. 1, lower test bed 6 is shown with a substantial number of test probes 10 along the near edge, and not elsewhere. Thus, as PCB 4 begins to settle against lower test bed 6, the near edge 34 of PCB 4 will tend to rotate upward relative to the far edge 36. Further, because upper test bed 8 has a plurality of test probes 14 at the far edge and not elsewhere, PCB 4 is encouraged to move such that near edge 34 rotates upward and far edge 36 rotates downward. This attempted rotation and resultant non-parallelism is undesired and can cause probes to misalign relative to their intended targets with the result that target probing does not occur. In some instances, waffling is sufficiently severe to warp the PCB, causing solder bonds and/or traces to crack.

The floating PCB, dynamically anchored structure of FIG. 1 is intrinsically unstable because the PCB is able to move slightly in response to unbalanced force from above or below. Because the PCB can move, it will be appreciated that the tolerance between tooling pins 18 and alignment holes 20, 22, 24, and between anchor stakes 30 and bushings 40 is relatively great.

The vacuum compression of jig 2 forces upper test bed 8 to seek proper alignment relative to frame anchor stakes 30, which stakes mate or register with bushings 40 in upper lid 26. As such, stakes 30 dynamically seek alignment with bushings 40 every time a PCB is tested, and the resultant friction can loosen the stake-bushing tolerance, contributing to probe misalignment. By way of example, assume that the mating of stakes 40 and bushings 30 will force edge 36 of upper test bed 8 to move slightly rightward. This brute force realignment will create a sideload on probes 14, dragging them rightward against the upper surface of PCB 4. As a result, the probe tips will bend or deflect leftward, perhaps sufficiently to cause the probe to misalign (e.g., not to contact) the intended target. Because the probes tips can swivel 360°, on subsequent measurements a bent probe tip can miss its intended target by a deflection distance in any direction. In addition to causing misalignment, sideloading can result in premature test probe breakage. While the replacement cost of an individual probe is small, the jig downtime to replace a probe can be substantial.

Prior art test jigs 2 generally do not function in a sequential fashion, but rather cause the upper and lower test beds to essentially simultaneously seek proper alignment and attempt to anchor the PCB under test. As noted, this mode of operation undesirably can produce test probe sideloading. Removing PCB 4 from jig 2 can be troublesome where, in an attempt to minimize misalignment, there is an especially tight fit between alignment tool pins 18 and holes 22. In such instances the PCB must be forcibly pried out of the jig, and stress damage to the PCB and/or components thereon can result.

Despite misalignment problems stemming from dynamic abrasion of tooling pins 18, from waffling that can cause misalignment, from vacuum created static electricity, and from sideloading of upper test bed probes, jigs such as depicted in FIG. 1 have been widely used in industry. However as PCBs become more densely populated with components, targets 12, 16 are, of necessity, being downsized.

While jigs 2 may function with 0.035" targets that can have 0.050" or larger center-center spacing, misalignment can occur after as few as several hundred cycles. For example, after only 300 cycles, tests by applicants of a prior art jig 2 disclosed average alignment errors of about 5.6 mils (e.g., 0.0056") on the PCB underside, and about 8.2 mils on the upperside. Further, the maximum scatter pattern (e.g., the pattern of actual contact by the test probes) was about 15.6 mils on the PCB underside and 21.6 mils on the PCB upperside. Unfortunately where newer PCBs include targets having 0.025" diameter spaced 0.050" or so, prior art jigs cannot reliably maintain the desired degree of alignment between test probe and target. Further, the prior art structure of FIG. 1 requires substantial retooling to accommodate a PCB with a different test probe pattern. Essentially, the entire jig 2 is dedicated to a specifically configured PCB.

What is needed is a test jig that can reliably maintain alignment between test probes and targets smaller than 0.035" diameter. Such jig should maintain the requisite degree of alignment over many operation cycles (e.g., several hundred thousand cycles, or more) and should not result in premature replacement of the test probes. Preferably such a test jig should avoid vacuum activation and the contamination and static electricity problems associated therewith. Such a test jig preferably should provide static alignment, be self-sequencing in its operation, and be readily adaptable to testing different PCBs. Finally, such a test jig should provide a mechanism for ejecting tight fitting PCBs from the jig after probing. The present invention discloses such a jig and a method of PCB probing using such a jig.

SUMMARY OF THE PRESENT INVENTION

Applicants' test jig includes a stationary main frame above which is top frame with a top cover hinged thereto, and below which is a bottom frame. When the jig is actuated, an actuating mechanism causes the top and bottom frames to move vertically and in parallel fashion toward the main frame. When the jig is manufactured, guide holes are simultaneously match drilled in the main, the top and the bottom frames. Stationary guide rods protrude above and below the main frame through the guide holes therein, and the rod ends matingly engage bushings affixed to the top and bottom frames. Registration between the guide rods and bushings preserves alignment between the main fixed frame, and the top and bottom frames on a per actuation basis.

The top cover hinges away from the top frame to permit a printed circuit board ("PCB") to be placed in the jig. The top frame includes two preferably cone-shaped upwardly protruding stakes that matingly engage cone-shaped bushings in the top cover as the cover is closed. These stakes and bushings provide essentially self-centering, minimal friction alignment of the top cover and top frame, notwithstanding repeated opening and closing of the hinged top cover.

The main frame has statically attached thereto a nest plate that preferably includes two upwardly projecting pins that align with two matching holes in the printed circuit board ("PCB") under test, thus ensuring registration between the PCB and the nest plate. The top cover carries an upper bed of nails, statically attached thereto, and a clamp plate biasedly mounted to the upper bed of nails and capable of vertical movement relative thereto. The clamp plate has a pattern of holes through which the test probes in the upper bed of nails protrude downward toward the upper surface of the PCB. The bottom frame carries a bottom bed of nails, statically attached thereto, whose test probes protrude upward through a pattern of holes in the nest plate toward the lower surface of the PCB. Most of the test jig is invariant for testing different PCB configurations, and customization of the test plate, the clamp plate and the top and bottom bed of nails dedicates the jig to a given PCB.

Proper absolute registration between the nest plate and the top and bottom bed of nails is ensured through the use of master tooling alignment holes and rods during setup of the test jig. The top bed of nails, the clamp plate, the nest plate and the bottom bed of nails each contain two precision drilled tooling holes. When these four elements are properly and absolutely vertically registered (e.g., in sandwich-like alignment), the tooling holes define two columns through which removable master tooling rods may be passed.

During setup, the bottom bed of nails is statically attached to the bottom frame. A tooling rod is then passed through the tooling holes in the bottom bed of nails and the nest plate, and the nest plate is statically attached to the main frame. The tooling rods are then also passed through the tooling holes in the clamp plate and top bed of nails, whereupon the top bed of nails is statically attached to the top cover.

While setup alignment may proceed in a different order, in this fashion absolute registration is ensured between the top and bottom bed of nails and the nest plate. Because registration between the top and bottom bed of nails and the nest plate is statically achieved, a high degree of alignment is maintained without the frictional deviations present in prior art dynamic alignment configurations. Since the clamp plate carries only holes, less tolerance is demanded in its registration.

In use, the top cover hinges open to permit a PCB to be placed on the nest plate, with the registration pins in the next plate passing through corresponding registration holes in the PCB. When the top cover is closed, the PCB is biased statically against the nest plate by the clamp plate. Upon jig actuation, the top frame and top bed of nails are moved vertically downward, increasing the clamp plate force against the PCB, which is already in a stable, parallel orientation relative to the main frame. The downward movement causes the probe tips in the upper bed of nails to protrude through corresponding holes in the clamp plate, and contact test targets on the upper surface of the PCB. Actuation preferably then causes the bottom frame to move upward, whereupon probe tips in the lower bed of nails protrude through holes in the nest plate to make contact with respective test targets on the lower surface of the PCB.

During activation and vertical movement of the top and bottom frames, the guide rods and bushings maintain parallelism between the top and bottom bed of nails relative PCB, which is already statically and stably retained against the nest plate. The guide rods and bushings are always in contact and are subjected to relatively small vertical movement therebetween during actuation. As a result, minimal alignment degradation occurs between the top, main and bottom frame due to friction, and repeatability of frame alignment is ensured. Since parallel movement of the top and bottom bed nails relative to the PCB is thus promoted, waffling, sideloading and test probe damage are minimized. As a result, test probe contacts with targets on the PCB are reliably achieved.

Where a single-sided PCB is to be tested, the target side of the PCB preferably faces the bottom bed of nails, and the top bed of nails will have no probes at all.

In a second aspect, a method for probing a PCB using a test jig is disclosed.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 2:
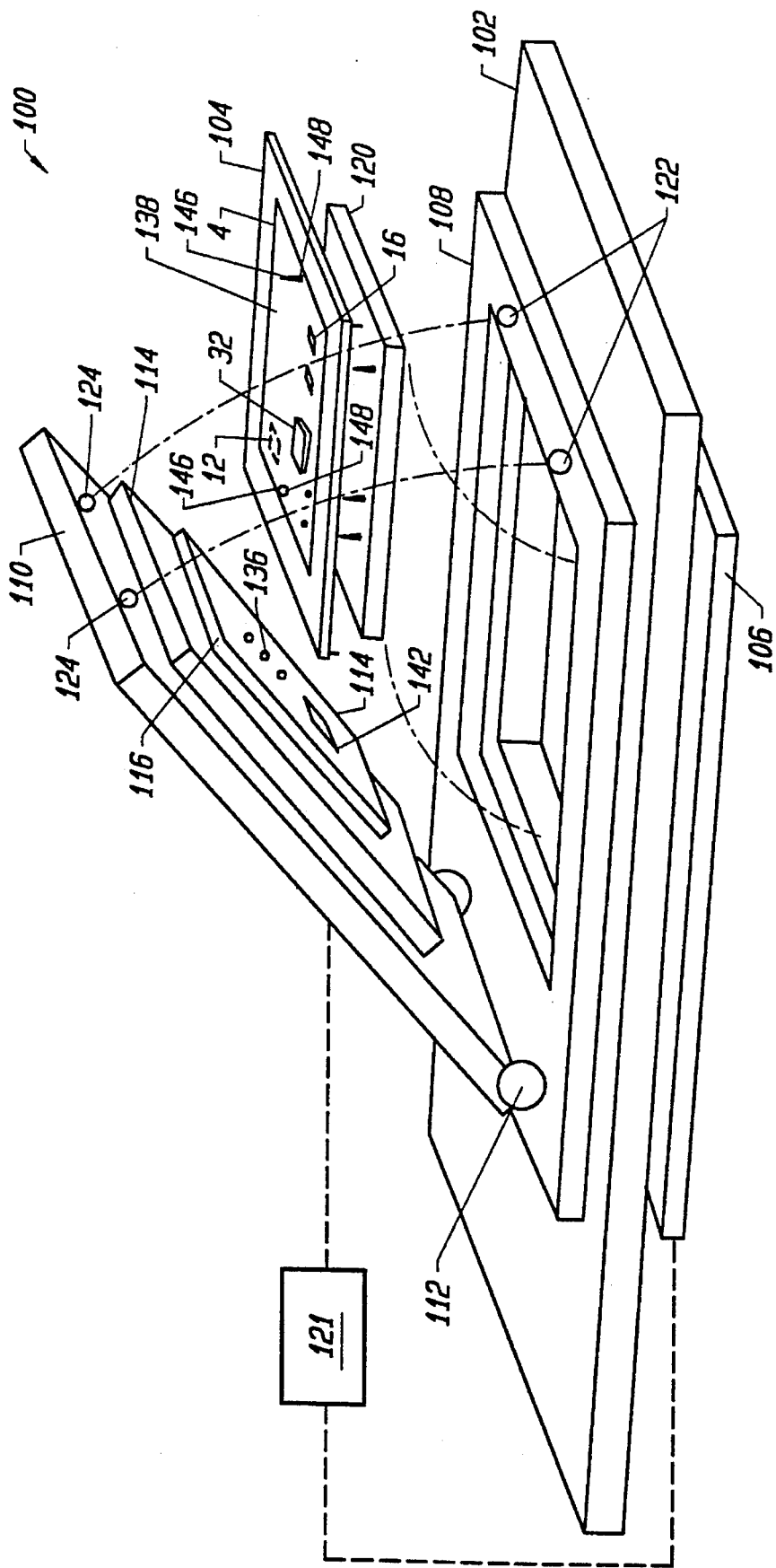
FIG. 2 is a perspective view of a preferred embodiment of a jig for probing a PCB, according to the present invention.
Figure 3:
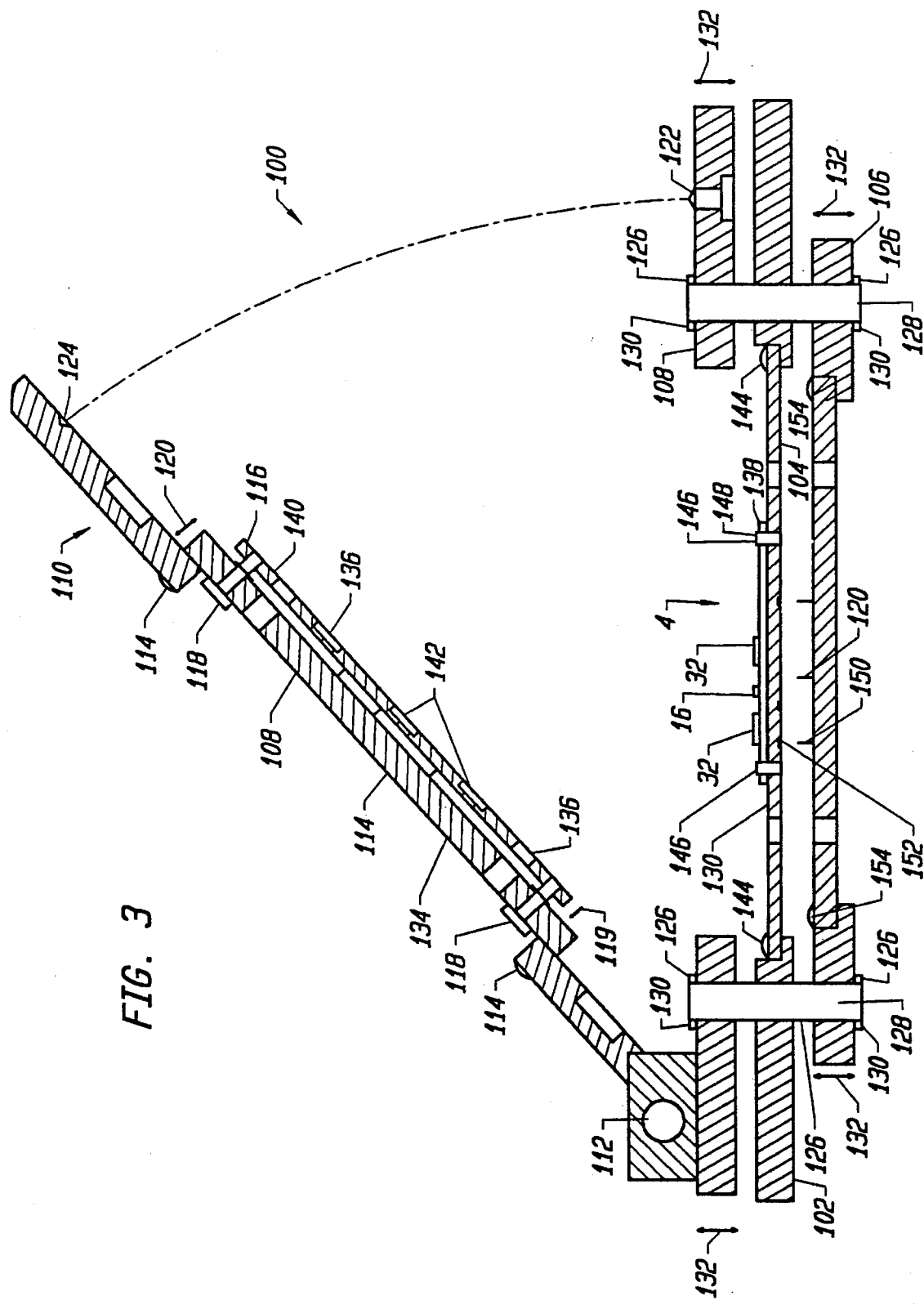
FIG. 3 is a cross-sectional sideview of a preferred embodiment of an open jig, according to the present invention, showing a PCB therein.

FIG. 2 depicts in simplified perspective a jig 100 according to the present invention as including a main fixed frame 102 to which is statically attached a nest plate 104, a bottom frame 106, a top frame 108 to which a top cover 110 assembly is attached by a hinge mechanism 112. With reference to FIG. 3, statically attached to the underside of top cover assembly 110 is a top bed of nails 114, to which a clamp plate 116 is biasedly attached by attachment mechanism 118. Attachment mechanism 118, which may be a spring loaded screw attachment, urges the clamp plate away from the top bed of nails, but permits vertical movement of the clamp plate relative to the top bed of nails, as indicated by arrows 119. A bottom bed of nails 120 is statically attached to the bottom frame 106.

Figure 1:
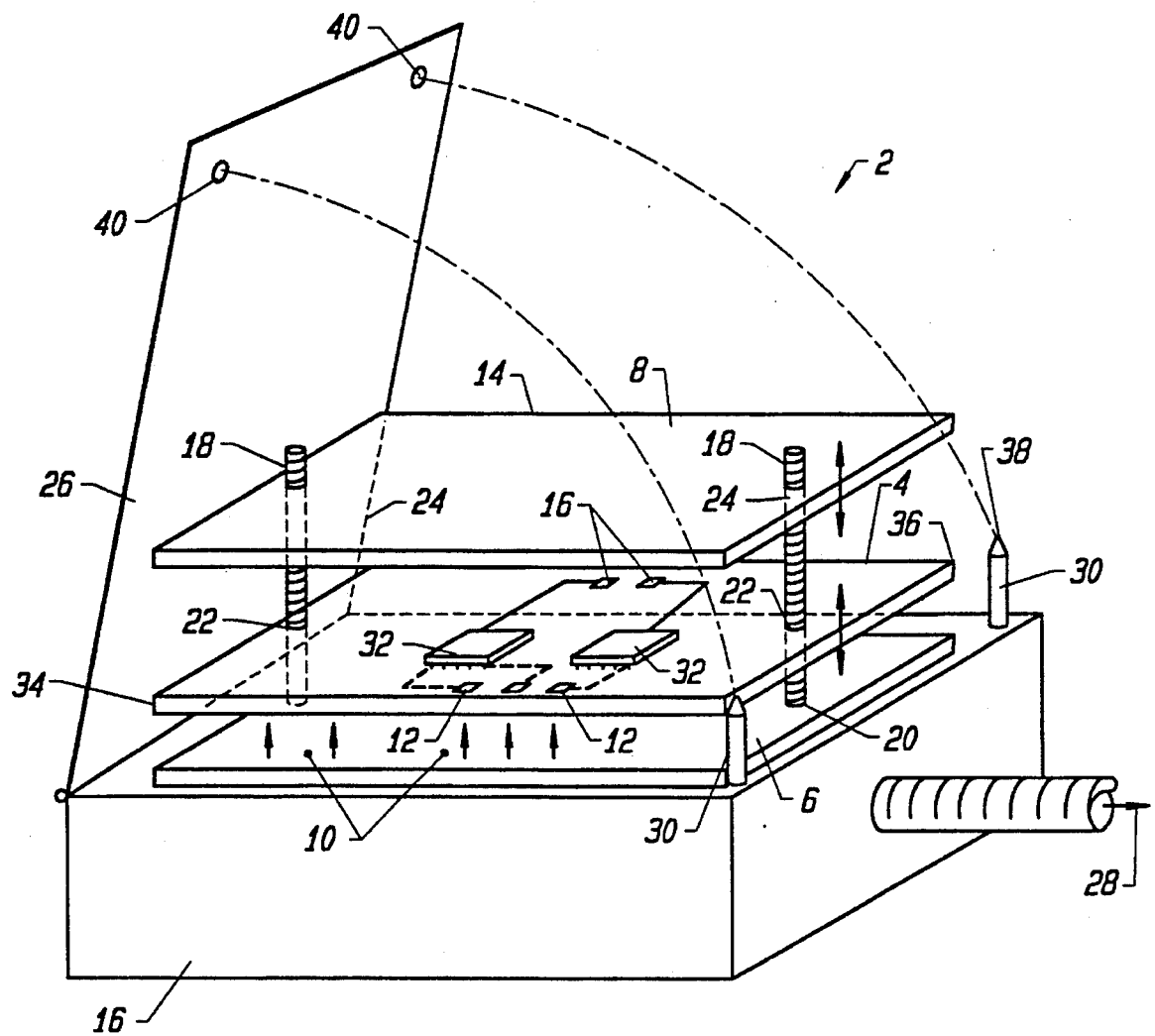
FIG. 1 depicts a jig for probing a PCB, according to the prior art.

Top cover assembly 110 is shown in an open disposition, to permit the printed circuit board 4 ("PCB") under test to be placed within jig 100. PCB 4 is similar to what has been described in FIG. 1, and includes components 32, and test targets 12 and 16. Jig 2 also includes an actuating mechanism 121 that controllably moves top frame 108 and bottom frame 106 vertically and in parallel disposition toward the main frame 102 and PCB 4.

In the following description, the present invention is described with respect to testing a two-sided PCB 4 having targets 12, 16 on both sides. However the present invention may of course be used for testing a PCB having targets on a single side. For ease of coupling wires to test probes, where a single-sided PCB 4 is to be tested, it is preferred that the PCB be placed in jig 100 such that the targets face the bottom bed of nails 120. In such case, the top bed of nails 114 will simply have no test probes, e.g., it will simply be a plane to which clamp plate 116 is biasedly attached. Of course, a single-sided PCB could instead be tested with the targets facing the top bed of nails 114, in which case test probes would be omitted from the bottom bed of nails 120.

With reference to FIG. 3, applicants' jig does not rely upon hinge mechanism 112 to maintain relative alignment between top cover assembly 110 and top frame 108. Instead, top frame 108 includes at least one and preferably two or more upwardly projecting cone shaped rods 122 that mate with corresponding cone shaped depressions 124 in the top cover assembly 110. These cone shaped rods and depressions ensure low friction, consistent self-centering alignment between the top cover and top frame as the jig is opened and closed.

During jig manufacture, the main frame 102, bottom frame 106, and top frame 108 are stacked sandwich-like in vertical alignment, and guide holes 126 are simultaneously match drilled through each frame. As best depicted in FIG. 3, stationary guide rods 128 protrude through guide holes 126 in the main frame 102, the ends of which rods matingly engage bushings 130 affixed to the outer surfaces of the bottom frame 106 and top frame 108. It is the registration enforced by the mating engagement of rods 128 and bushings 130 that ensures alignment between the main frame and the top and bottom frames over each actuation of the jig. As will be appreciated, minimal friction and wear and tear occurs between rods 128 and bushings 130 as these components are always in contact (when the jig is closed), and experience but slight relative vertical motion upon actuation.

During actuation, as shown by arrows 132, the upper frame 108 and the lower frame 106 are moved vertically towards (and later away from) main frame 102. The vertical motion is relatively small, e.g., 0.2" (5 mm), and since guide rods 128 and bushings 30 are always in contact with one another, there is minimal friction and loss of alignment tolerance therebetween. Thus, during actuation, the main, top and bottom frames remain in parallel disposition to each other, and (as will now be described), the top bed of nails and bottom bed of nails move in parallel disposition toward the nest plate and PCB under test.

As seen in FIG. 3, the top bed of nails 114 includes downwardly projecting test probes 134 that can pass through corresponding openings 136 in the clamp plate 116. The underside 140 of clamp plate 116 preferably includes depressions 142 that correspond matingly to the projecting dimensions of components 32, solder joints and the like on the upper surface 138 of the PCB 4. In this fashion, the clamp plate can fit flushly against the upper surface of the PCB. When the top cover assembly 110 is in a closed position (e.g., FIG. 4), clamp plate 116 is biasedly urged against the PCB 4. Of course by virtue of the cooperation between pins 146 and holes 148, the stationary PCB will already be in registered static alignment with the stationary nest plate 104.

For ease of illustration in FIG. 2, the nest plate 104 is depicted as being removed from the main frame 102. However nest plate 104 is in fact statically attached to the main frame 102 by screws 144 or the like, as shown in FIG. 3. Nest plate 104 includes at least one and preferably two upwardly projecting pins 146 that protrude through mating pin holes 148 in PCB 4. When the PCB is placed atop nest plate 104, the mating alignment of pins 146 and holes 148 ensures proper registration between PCB and the nest plate.

With further reference to FIG. 3, the bottom bed of nails 120 includes upwardly projecting test probes 150 that can pass through corresponding openings 152 in the nest plate 104. The bottom bed of nails is statically attached to the bottom frame 106 by screws 154, or the like.

Upon actuation by mechanism 121, top frame 108 (to which top cover assembly 110 is firmly attached in a closed disposition) moves vertically downward. This downward motion first causes clamp plate 116 to more firmly secure the already stationary PCB 4 against the stationary nest plate. Next, this downward motion then causes test probes 134 to protrude through openings 136 and make appropriate contact with targets 16 on the upper surface 138 of PCB 4. Finally, actuation causes the bottom frame 106 and bottom bed of nails 120 move vertically upward (indicated by lower arrows 132). This upward motion causes test probes 150 to protrude through openings 152 and make appropriate contact with targets 12 on the lower surface of PCB 4.

During manufacture, preferably two or more precision tooling holes 156 are drilled through the nest plate 104, top and bottom beds of nails 114, 120 and clamp plate 116. These precision holes are drilled such that when these four elements are stacked in properly registered vertical alignment, a through column is defined.

Figure 4:
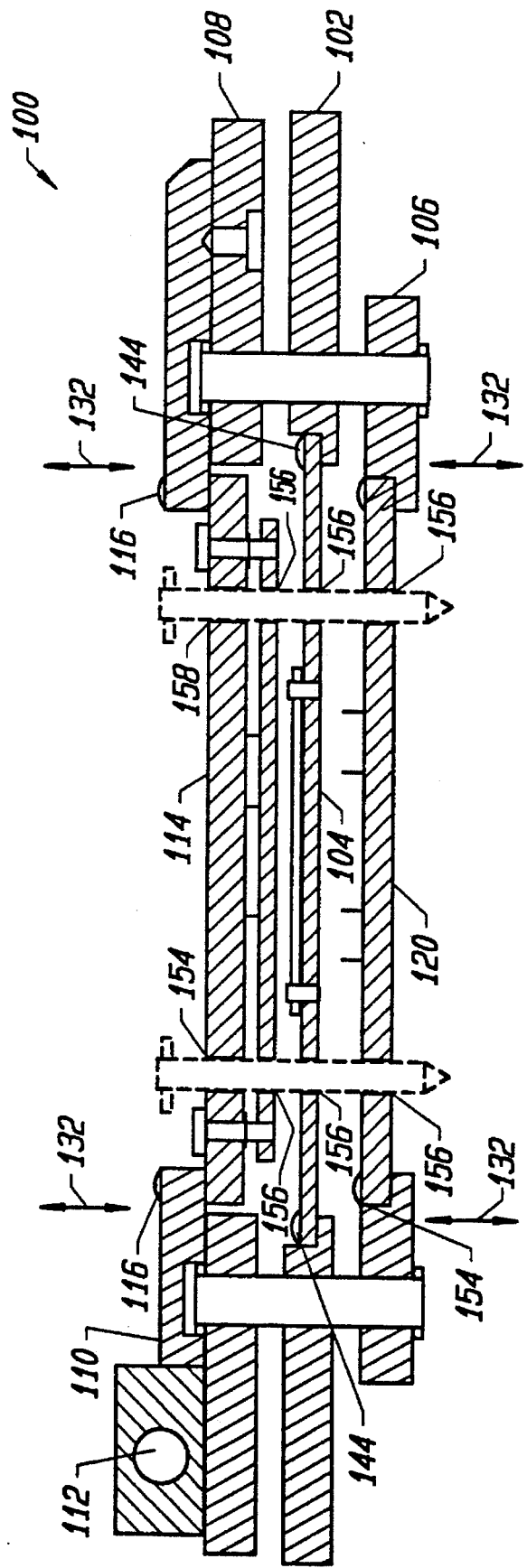
FIG. 4 is a cross-sectional sideview of the jig shown in FIG. 3, but in a closed disposition.

With reference to FIG. 4, during setup of the jig, a removable master tooling rod 158 (shown in phantom) is passed through the column defined by tooling holes 154 to ensure registration, as will now be described. For example, the bottom bed of nails 120 is statically attached to the bottom frame 106 with screws 154 or the like. A tooling rod 158 is then passed through the tooling holes 156 in the bottom bed of nails 106 and the nest plate 104, and the nest plate is statically attached to the main frame with screws 144, or the like. The tooling rods are then also passed through the tooling holes in the clamp plate 116 and top bed of nails 114, whereupon the top bed of nails is statically attached to the top cover assembly 110 with screws 160, or the like.

While setup alignment may proceed in a different order, in this fashion absolute registration is ensured between the top and bottom bed of nails and the nest plate. Because registration between the top and bottom bed of nails and the nest plate is statically achieved, a high degree of alignment is maintained without the frictional deviations present in prior art dynamic alignment configurations. Since the clamp plate carries only holes, less tolerance is demanded in its registration.

Figure 5A:
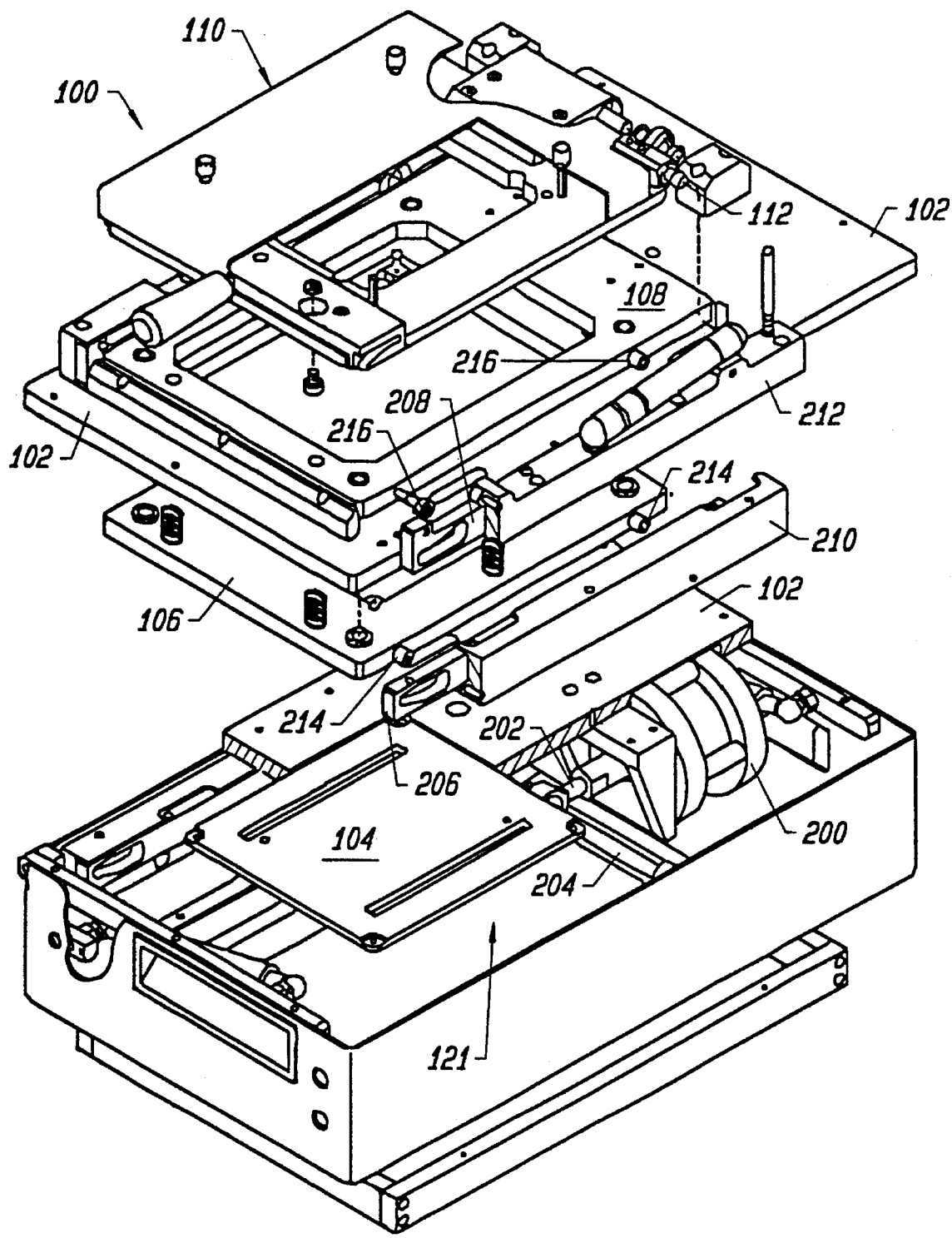
FIG. 5A is a simplified cutaway perspective view of the a jig wherein a preferred actuator is depicted, according to the present invention.
Figure 5B:
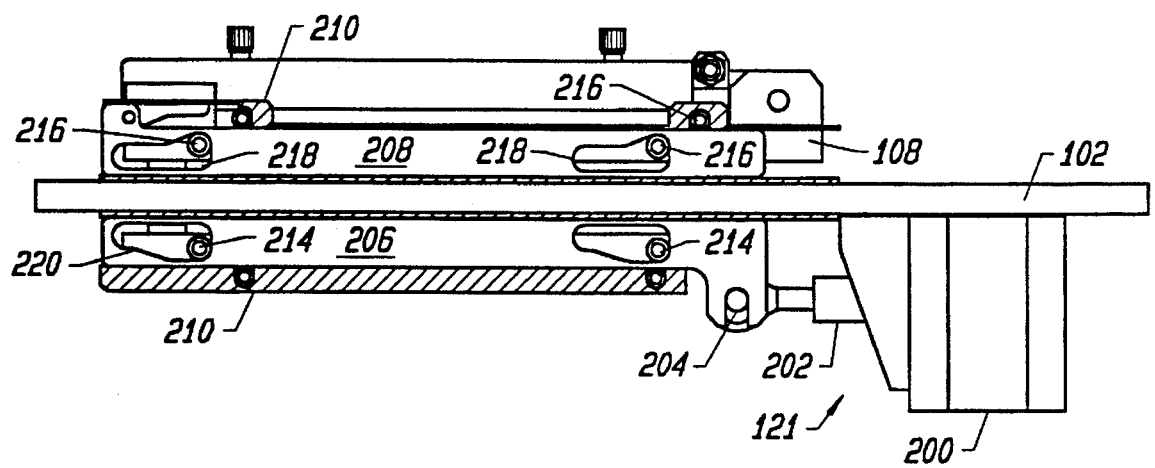
FIG. 5B is a sideview of a jig in a non-actuated disposition, according to the present invention.
Figure 5C:
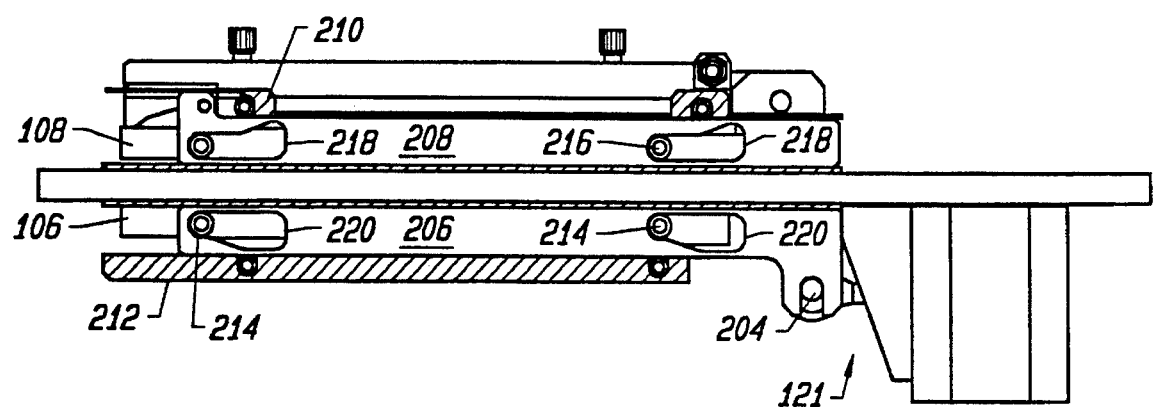
FIG. 5C is a sideview of a jig in a second actuated disposition, according to the present invention.

The actuation mechanism 121 will now be described in detail with reference to FIGS. 5A–5C. FIGS. 5A–5C differ in orientation from what has been depicted in FIGS. 2–4 in that top cover assembly 110 is now shown as being hinged from top frame 108 at the right edge rather than at the left edge. For ease of illustration, FIG. 5A does not depict the top or bottom bed of nails, and depicts mainframe 102 twice. In the lower portion of the figure, mainframe 102 is shown partially cutaway to reveal the actuator mechanism 121, and in the upper portion of the figure, mainframe 102 is shown sandwiched between the top frame 108 and the bottom frame 106.

After the jig has been setup or aligned, the jig top cover assembly 110 is hinged open, and a PCB 4 is placed against the stationary nest plate 104, where it is held in registered static alignment by the cooperation between pins 146 and holes 148 (see FIGS. 2 and 3). The top cover assembly is then hinged closed, whereupon clamp plate 116 biasedly urges the PCB 4 against the nest plate 104, as depicted in FIG. 4. The jig mechanism 121 is then actuated, manually or by automatically sensing closure of the top cover assembly 110.

As shown by FIG. 5A, jig mechanism 21 includes a mechanism 200 that is preferably an air cylinder. Mechanism 200 includes a shaft 202 that is extended laterally in a non-actuated state (FIG. 5B), and that is withdrawn laterally in an actuated state (FIG. 5C). Attached to the protruding end of shaft 202 is a cross member 204 whose free ends are coupled to lower and upper cam assemblies 206. Cam assemblies 206, 208 are free to move laterally within cam guide housings 210, 212 that are statically attached to the main frame 102.

With reference to FIGS. 5A–5C, the bottom and top frames 106, 108 include outwardly projecting roller pegs 214, 216 that engage respectively against preferably ramped cam surfaces 218, 220 in the cam assemblies. For example, in the non-actuated state shown in FIG. 5B, the roller pegs 216 associated with the top frame 108 are shown contacting the upper end of a ramped portion of cam surface 218, whereas the roller pegs 214 associated with bottom frame 106 are shown contacting a horizontal or flat region of cam surface 220.

With reference to FIGS. 5B and 5C, upon actuation, mechanism 200 draws shaft 202 and cam assemblies 206, 208 laterally rightward. Comparing the position of roller pegs 216 in FIG. 5B with FIG. 5C, it will be appreciated that as cam assembly 208 is moved laterally to the right, the contact between the roller pegs and the ramped and then the flat cam surfaces 216 first cause the top frame 108 to move vertically downward toward the stationary main frame 102. While top frame 108 is being moved vertically, the flat region of cam surface 220 ensures no vertical movement of the bottom frame 106. However by suitably shaping the cam surfaces 218, 220, after the top frame is suitably urged towards the main frame, the ramp portion of cam surface 220 engages roller 214 such that the bottom frame 106 is then moved vertically upward. Of course as the top and bottom frames are thus moved, the corresponding probes on the top and bottom bed of nails are biased into contact with the respective targets on either side of the PCB under test.

In the preferred embodiment, a commercially available 2.5" diameter (6.2 cm) "Bimba" brand air cylinder operating under about 60 psi compressed air was used to move shaft 202 laterally about 1.5" (3.7 cm). The cam surfaces 218, 220 had a lateral length of about 1.5" (3.7 cm), and narrow height of about 0.4" (1 cm) and a maximum height (ramp height) of about 0.6" (1.5 cm). This configuration provided about a 3.5:1 mechanical advantage, and exerted about 565 pounds force, and caused the top and bottom frames to move vertically about 0.2" (0.5 cm). In the preferred embodiment, where the lateral actuation stroke is defined as 100%, the top frame begins vertical movement at perhaps 5% of the stroke and completes vertical movement at perhaps 65% of the stroke, whereas the bottom frame begins actuation at about 50% of the stroke and completes its vertical movement at 100% of the stroke.

In practice, jig actuation (resulting in the configuration of FIG. 5C) can occur in about a second or less, whereupon test probing may last from ten seconds to many minutes or more, depending upon the nature of the circuitry being probed, the extent of the required testing, and the like. After probing is complete, actuation is reversed, resulting in the configuration of FIG. 5B.

In actual testing, a test jig according to the present invention after 50,000 actuation test cycles more accurately probed 0.025" diameter targets spaced 0.050" than a prior art jig after 300 cycles. Based on applicants' experiences to date, a test jig according to the present invention should maintain probe accuracy over a number of actuations approaching one million, if not more.

Other actuation sequences are of course possible, and may be implemented in the preferred embodiment by suitably shaping the various cam surfaces. Further, those skilled in the art will recognize that the actuation mechanism may of course be implemented in many ways. For example, mechanism 200 may be a solenoid, or a motor with gears. Similarly, the camming mechanism may be implemented in a variety of ways, or may be fact be replaced with a system of timed vertical displacements of the upper and lower frames.

While different actuation sequences may be used, a further advantage of the preferred embodiment is that after probing has occurred, a PCB that is stuck against the nest plate (due to a tight fit perhaps) may be ejected by re-actuating the jig with the top cover assembly open. In this mode, when the bottom frame moves vertically upward, the unopposed force exerted by the bottom bed of nails will safely eject the PCB vertically upward.

Applicants' test jig was tested against a standard, conventional, test fixture, by measuring the offset from the center of a test target on the PCB to where the test probe intended to contact that target actually contacted the PCB. Measurements were made using an X, Y table, and a video camera coupled to a microscope. While targets on the PCBs tested with the present invention were 25 mil, and targets on PCBs tested with the conventional fixture were 35 mil, target and probe tip size were unimportant since test measurements were from target center to probe tip center.

Applicants' test jig and the conventional fixture each showed an average error from target center of about 5 mils, which offset represented registration error associated with manufacture of the PCBs, e.g., the PCB artwork and the registration holes did not quite agree. However applicants' jig exhibited a maximum scatter of only 8.2 mils (primary, or down-facing PCB side) to 8.8 mils (secondary side), whereas the conventional fixture exhibited a maximum scatter of 15.8 mils (secondary side) to 21.6 mils (primary side). What is meant by scatter is the range of the shotgun-like pattern representing distances separating target center from probe center. Understandably, waffling and probe tip bending will increase scatter. The 2–3 times improvement in scatter associated with applicants' jig is attributed to the jig's relative lack of waffling, and to minimal probe bending. It is also noted that this 2–3 times scatter improvement was measured after the prior art fixture had been used for only about 350 cycles, but after applicants' jig had been used for more than 50,000 cycles.

Modifications and variations may be made to the disclosed embodiments without departing from the subject and spirit of the invention as defined by the following claims.

What is claimed is:

1. A test jig for probing a circuit board whose first surface includes at least a first test target which may be on either side of said circuit board, the jig comprising:

a stationary nest plate defining a nest plane and including means for statically retaining said circuit board in a predetermined registration alignment with said nest plate;

a first bed of nails defining a first bed plane and including at least a first probe intended to electrically contact said first test target, a clamp plate, biasedly attached to said first bed of nails, and including a through opening positioned to permit said first probe to pass therethrough and contact said first test target; and actuation means for displacing said first bed of nails along a path substantially perpendicular to said nest plane, maintaining said circuit board in a plane parallel to said nest plane while maintaining parallel registration between said first bed plane and said nest plane including means for urging said first bed of nails against said circuit board such that said first bed plane and said nest plane retain a parallel relationship during actuation and probing of said test jig;

wherein following actuation said first probe contacts said first test target.

2. The test jig of claim 1, wherein said nest plate and said first bed of nails include at least one through tooling hole defining a through column when said nest plate and said first bed of nails are placed in registered alignment.

3. The test jig of claim 2, further including:

a main frame, wherein said nest plate is statically attached to said main frame; and a top frame, wherein said first bed of nails is statically attached to said top frame;

wherein said tooling hole permits a tooling rod to be passed through said nest plate and said first bed of nails to ensure registration therebetween while statically attaching said nest plate to said main frame and said first bed of nails to said top frame.

4. A test jig for probing a circuit board whose first surface includes at least a first test target and whose second surface includes at least a second test target, the jig comprising:

a main frame;

a nest plate defining a nest plane and being statically attached to said main frame;

said nest plate including means for statically retaining said circuit board in a predetermined registration alignment with said nest plate and defining at least one through hole coinciding with a location of said second test target on said printed circuit board;

a first frame overlying said main frame;

a cover assembly, hingedly attached to said first frame to permit access to said nest plate;

a first bed of nails defining a first bed plane and including a first probe intended to electrically contact said first test target, said first bed of nails being statically attached to a portion of said cover assembly facing said nest plate such that said first probe points toward said nest plate;

a second frame underlying said main frame;

a second bed of nails including a second probe intended to electrically contact said second test target, said second bed of nails being statically attached to a portion of said second frame facing said nest plate such that said second probe points toward said nest plate; and actuation means for displacing said first frame and said second frame along a path substantially perpendicular to said nest plane, maintaining said circuit board in a plane parallel to said nest plane while maintaining parallel registration between said first bed of nails, said printed circuit board and said second bed of nails;

wherein following actuation said first probe contacts said first test target and said second probe contacts said second test target.

5. The test jig of claim 4, further including a clamp plate, biasedly attached to said first bed of nails, and defining at least one through opening permitting said first test probe to pass therethrough and electrically contact said first target.

6. The test jig of claim 4, wherein said nest plate, said first bed of nails and said second bed of nails each include at least one through tooling hole defining a through column when said nest plate, said first bed of nails and said second bed of nails are placed in registered alignment.

7. The test jig of claim 6, wherein during alignment a tooling rod establishes registered alignment between at least said second bed of nails and said nest plate, permitting at least one of said second bed of nails and said nest plate to be statically attached to said test jig.

8. The test jig of claim 6, wherein during alignment a tooling rod established registered alignment between at least said first bed of nails and said nest plate, permitting at least one of said first bed of nails and said nest plate to be statically attached to said test jig.

9. The test jig of claim 6, wherein said actuation mechanism includes a cam and a roller pin projecting from at least one of said first and second frames, said roller pin contacting said cam and causing at least one of said first and second frames to move relative to said main frame during actuation.

10. The test jig of claim 4, wherein said main frame, said first frame and said second frame each include a precision through guide opening, formed simultaneously in said main frame, first frame and second frame during manufacture, which precision through guide openings define a guide column when said main frame, first frame and second frame are placed in registered alignment.

11. The test jig of claim 10, further including:

a guide rod extending on either side of said main frame such that end of said guide rod may protrude through said guide openings in said first and second frames; and a guide bushing disposed circumferentially about said guide opening on at least one of said first and second frames, such that said guide rod passes at least partially through said guide bushing.

12. The test jig of claim 11, wherein:

said actuation means causes said first frame to move toward said main frame and causes said second frame to move toward said main frame;

said guide rod maintaining registration between said main frame, said first frame, and said second frame during actuation.

13. A method for probing a circuit board whose first surface includes at least a first test target, the method comprising the following steps:

(a) providing a stationary nest plate that includes means for statically retaining said circuit board in a predetermined registration alignment therewith, said nest plate defining a nest plate plane;

(b) placing said circuit board against said nest plate in registered alignment;

(c) providing a first bed of nails including a first probe intended to electrically contact said first test target, said first bed of nails defining a first bed plane;

(d) moving said first bed of nails toward said circuit board while maintaining a parallel relationship between said first bed plane and said nest plate plane;

wherein said first probe contacts said first test target.

14. The method of claim 13, including the further step of:

(e) urging said circuit board toward said nest plate before said first probe contacts said first test target.

15. The method of claim 14, including the further steps of:

(i) providing a main frame to which said nest plate is statically attached;

(j) providing a first frame overlying said main frame;

(k) providing a cover assembly, attached to said first frame to provide access to said nest plate, said first bed of nails being statically attached to said cover assembly;

(l) providing a second frame underlying said main frame, said second bed of nails being statically attached to said second frame;

(m) providing guide means, operating on said main frame, said first frame and said second frame, to maintaining a parallel relationship between said main frame, first frame and second frame, while permitting movement of said first and second frames relative to said main frame.

16. The method of claim 15, wherein step (m) includes:

(n) simultaneously forming during manufacture of said main frame, first frame and second frame, at least one precision guide through opening such that when placed in registered alignment said main frame, first frame and second frame for a guide column; and (o) positioning a guide rod extending through and on either side of said precision guide through opening in said main frame, wherein ends of said guide rod matingly engage precision guide through openings in said first and second frames to promote said parallel relationship.

17. The method of claim 15, wherein alignment between said first bed of nails, said second bed of nails, and said nest plate is promoted by performing the following steps:

(p) forming simultaneously in said first bed of nails, said second bed of nails, and said nest plate at least one precision through tooling hole, such that when said first bed of nails, said second bed of nails, and said nest plate are placed in registered alignment, a tooling column is defined;

(q) statically attaching a chosen one of said first bed of nails to said cover plate, said nest plate to said main frame, and said second bed of nails to said second frame;

(r) passing a tooling rod through whichever of said first bed of nails, said nest plate, and said second bed of nails was chosen for statically attaching in step (q) and at least one unchosen of said first bed of nails, said nest plate, and said second bed of nails;

(s) statically attaching said at least one unchosen of said first bed of nails, said nest plate, and said second bed of nails referred to in step (r) to a corresponding one of said cover plate, said main frame, and said second frame;

(t) if not already done in step r, passing a tooling rod through whichever of said first bed of nails, said nest plate, and said second bed of nails was not statically attached in step (q) or in step (s), and at least one of said first bed of nails, said nest plate, and said second bed of nails as was statically attached in step (q) or step (s);

(u) statically attaching whichever of said first bed of nails, said nest plate, and second bed of nails was not statically attached in step (q) or in step (s) to a corresponding one of said cover plate, said main frame, and said second frame; and (v) removing said tooling rod.

18. The method of claim 15, wherein alignment between said first bed of nails, said second bed of nails, and said nest plate is promoted by performing the following steps:

(p) forming simultaneously in said first bed of nails, said second bed of nails, and said nest plate at least one precision through tooling hole, such that when said first bed of nails, said second bed of nails, and said nest plate are placed in registered alignment, a tooling column is defined;

(q) passing a tooling rod through at least two elements selected from the group consisting of said first bed of nails, said nest plate, and said second bed of nails;

(r) statically attaching a chosen one element though which said tolling rod is passed in step (q), wherein if said chosen one element is said first bed of nails static attachment is to said cover plate, if said chosen one element is said nest plate attachment is to said main frame, and if said chosen one element is said second bed of nails attachment is to said second frame;

(s) statically attaching at least one unchosen of said first bed of nails, said nest plate, and said second bed of nails referred to in step (r) to a corresponding one of said cover plate, said main frame, and said second frame;

(t) passing a tooling rod through whichever of said first bed of nails, said nest plate, and said second bed of nails was not statically attached in step (r) or in step (s), and at least one of said first bed of nails, said nest plate, and said second bed of nails as was statically attached in step (r) or step (s);

(u) statically attaching whichever of said first bed of nails, said nest plate, and said second bed of nails was not statically attached in step (r) or in step (s) to a corresponding one of said cover plate, said main frame, and said second frame; and (v) removing said tooling rod.

19. The method of claim 14, wherein said steps of moving are accomplished by providing an actuator driven cam assembly, coupled to said first and second frames.

20. The method of claim 13, wherein said circuit board further includes a second surface having a second test target, including the further steps of:

(f) forming at least one through opening in said nest plate positioned to coincide with said second test target;

(g) providing a second bed of nails including a second probe intended to electrically contact said second target, said second bed of nails defining a second bed plane;

(h) moving said second bed of nails toward said circuit board while maintaining a parallel relationship between said nest plate plane and said second bed plane;

wherein said second probe contacts said second test target.

* * * * *